(12) United States Patent
Ow et al.

(10) Patent No.: US 11,881,385 B2
(45) Date of Patent: Jan. 23, 2024

(54) METHODS AND APPARATUS FOR REDUCING DEFECTS IN PRECLEAN CHAMBERS

(71) Applicant: APPLIED MATERIALS, INC., Santa Clara, CA (US)

(72) Inventors: Yueh Sheng Ow, Singapore (SG); Yuichi Wada, Chiba (JP); Junqi Wei, Singapore (SG); Kang Zhang, Singapore (SG); Ananthkrishna Jupudi, Singapore (SG); Sarath Babu, Singapore (SG); Kok Seong Teo, Singapore (SG); Kok Wei Tan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 483 days.

(21) Appl. No.: 16/857,828

(22) Filed: Apr. 24, 2020

(65) Prior Publication Data
US 2021/0335582 A1 Oct. 28, 2021

(51) Int. Cl.
*H01J 37/32* (2006.01)
*H01L 21/67* (2006.01)

(52) U.S. Cl.
CPC .. *H01J 37/32495* (2013.01); *H01J 37/32504* (2013.01); *H01L 21/67028* (2013.01); *H01J 2237/335* (2013.01)

(58) Field of Classification Search
CPC . B08B 5/00; C23C 16/4404; H01L 21/67028; H01L 21/6719; H01L 21/68742; H01J 37/32477–32504; H01J 37/32559; H01J 2237/0268; H01J 2237/335
See application file for complete search history.

(56) References Cited

U.S. PATENT DOCUMENTS

| 6,442,950 B1 * | 9/2002 | Tung | H01L 21/67109 118/724 |
| 6,716,302 B2 | 4/2004 | Carducci et al. | |
| 8,444,926 B2 * | 5/2013 | Fodor | C23C 16/46 156/345.37 |
| 8,747,555 B2 * | 6/2014 | Yamada | C23C 16/44 118/724 |
| 2004/0002221 A1 * | 1/2004 | O'Donnell | H01J 37/32467 438/710 |

(Continued)

FOREIGN PATENT DOCUMENTS

| JP | 2012-229479 A | 11/2012 |
| KR | 10-2014-0028377 A | 3/2014 |
| KR | 10-2015-0050013 A | 5/2015 |

OTHER PUBLICATIONS

International Search Report for PCT/US2021/028168, dated Aug. 5, 2021.

*Primary Examiner* — Benjamin Kendall
(74) *Attorney, Agent, or Firm* — MOSER TABOADA

(57) ABSTRACT

Apparatus and methods use a unique process kit to protect a processing volume of a process chamber. The process kit includes a shield with a frame configured to be insertable into a shield and a foil liner composed of a metallic material that is attachable to the frame at specific points. The specific attachment points are spaced apart to produce an amount of flexibility based on a malleability of the metallic material. The amount of flexibility ranges from approximately 2.5 to approximately 4.5.

20 Claims, 5 Drawing Sheets

(56) References Cited

U.S. PATENT DOCUMENTS

| | | |
|---|---|---|
| 2007/0158188 A1 | 7/2007 | Ivanov |
| 2008/0029032 A1 | 2/2008 | Sun et al. |
| 2010/0055298 A1* | 3/2010 | Sommers ................ C23C 14/35 |
| | | 134/41 |
| 2010/0108263 A1* | 5/2010 | Nguyen ............ H01J 37/32495 |
| | | 156/345.33 |
| 2010/0119843 A1* | 5/2010 | Sun .................... H01J 37/32477 |
| | | 427/523 |
| 2011/0207332 A1 | 8/2011 | Liu et al. |
| 2011/0232845 A1 | 9/2011 | Riker et al. |
| 2014/0190636 A1* | 7/2014 | Shin ................. H01J 37/32495 |
| | | 118/723 R |
| 2016/0189936 A1* | 6/2016 | Chia ................. C23C 16/45563 |
| | | 156/345.33 |
| 2017/0145553 A1* | 5/2017 | Liu ......................... C23C 4/134 |
| 2018/0076010 A1 | 3/2018 | Sheelavant et al. |

* cited by examiner

METHODS AND APPARATUS FOR REDUCING DEFECTS IN PRECLEAN CHAMBERS

FIELD

Embodiments of the present principles generally relate to wafer level packaging of semiconductor structures.

BACKGROUND

Process chambers may be configured to perform a precleaning process. For example, such preclean chambers can remove native oxide on metal contact pads of a substrate prior to physical vapor deposition (PVD) for depositing one or more barrier layers, e.g., titanium (Ti), copper (Cu), etc., on the substrate and to remove other materials. Preclean chambers, typically, use ion bombardment (induced by RF plasma) to remove by etching the native oxide on the metal contact pads and other materials. The preclean process lowers contact resistance between the metal contacts on the substrate to enhance performance and power consumption of integrated circuits on the substrate and to promote adhesion. To perform a plasma cleaning process, an integrated circuit is placed in a plasma chamber and a pump removes most of the air from the chamber. Electromagnetic energy (e.g., radio frequency) is applied to an injected gas, such as argon, to excite the injected gas into a plasma state. The plasma releases ions that bombard the surface of the substrate to remove contaminants and/or material from the substrate. Atoms or molecules of the contaminants and/or substrate material are etched from the substrate and are, for the most part, pumped out of the chamber. However, some of the contaminant and/or etched material may be redeposited on surfaces of the chamber. Process kits are typically used to reduce or prevent deposition of contaminants and/or etched materials onto surfaces of the chamber. The resputtering of the deposition materials on the process kit is a key factor in deciding when periodic maintenance should be performed on the preclean chamber. The deposition buildup may limit the preclean chamber to 2,000 or less wafers before periodic maintenance is required.

Accordingly, the inventors have provided embodiments that increase the wafer numbers between required cleanings of the preclean chamber.

SUMMARY

Methods and apparatus for improving wafer run numbers between cleaning intervals are provided herein.

In some embodiments, an apparatus for protecting a processing volume of a process chamber may comprise a frame configured to be insertable into a process kit shield and a foil liner composed of a metallic material that is attachable to the frame at specific points, wherein the specific points being spaced apart to produce an amount of flexibility based on a malleability of the metallic material, and wherein the amount of flexibility per GPa is approximately 2.5 to approximately 4.5.

The apparatus may further include wherein the amount of flexibility is further based on an internal stress of a material to be deposited onto the foil liner, the frame is formed from aluminum, copper, titanium, or stainless steel, the foil liner is made of aluminum, copper, titanium, nickel, or gold, the foil finer is aluminum and the specific points are spaced approximately 30 mm apart, the foil liner is rectangular or circular in shape, the frame is attachable to the process kit shield with a screw type fastener, a diffuser with the foil liner attached to a lowermost portion, the diffuser has a removable cap in the lowermost portion, the foil liner being attached to the removable cap, the frame is approximately 3 mm in thickness, and/or the foil liner is attachable to the frame using a fiber laser with pulsing capability.

In some embodiments, an apparatus for processing semiconductor structures may comprise a preclean chamber having a chamber body with a processing volume, a process kit that surrounds at least a portion of the processing volume, a frame inserted into the process kit, and a foil liner composed of a metallic material that is attached to the frame at specific points, wherein the specific points being spaced apart to produce an amount of flexibility based on a malleability of the metallic material, and wherein the amount of flexibility is approximately 2.5 to approximately 4.5.

The apparatus may further include the amount of flexibility is further based on an internal stress level of a material to be deposited onto the foil liner, the frame is formed from aluminum, copper, titanium, or stainless steel, the foil liner is made of aluminum, copper, titanium, nickel, or gold, the foil liner is aluminum and the specific points are spaced approximately 30 mm apart, and/or the frame is attachable to the process kit with a screw type fastener.

In some embodiments, a method of protecting a process kit may comprise forming a frame that is attachable to at least a portion of a process kit for a preclean, chamber, attaching the frame to an inner surface of the process kit, and attaching a foil liner to an inner surface of the frame at specific points that are spaced apart achieve an amount of flexibility based on a malleability of a material forming the foil liner, the amount of flexibility per GPa ranges from approximately 2.5 to approximately 4.5.

The method may further include the amount of flexibility is further based on an internal stress level of a material to be deposited on the foil liner and/or the material to be deposited on the foil liner is silicon nitride, silicon oxide, or polymer.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
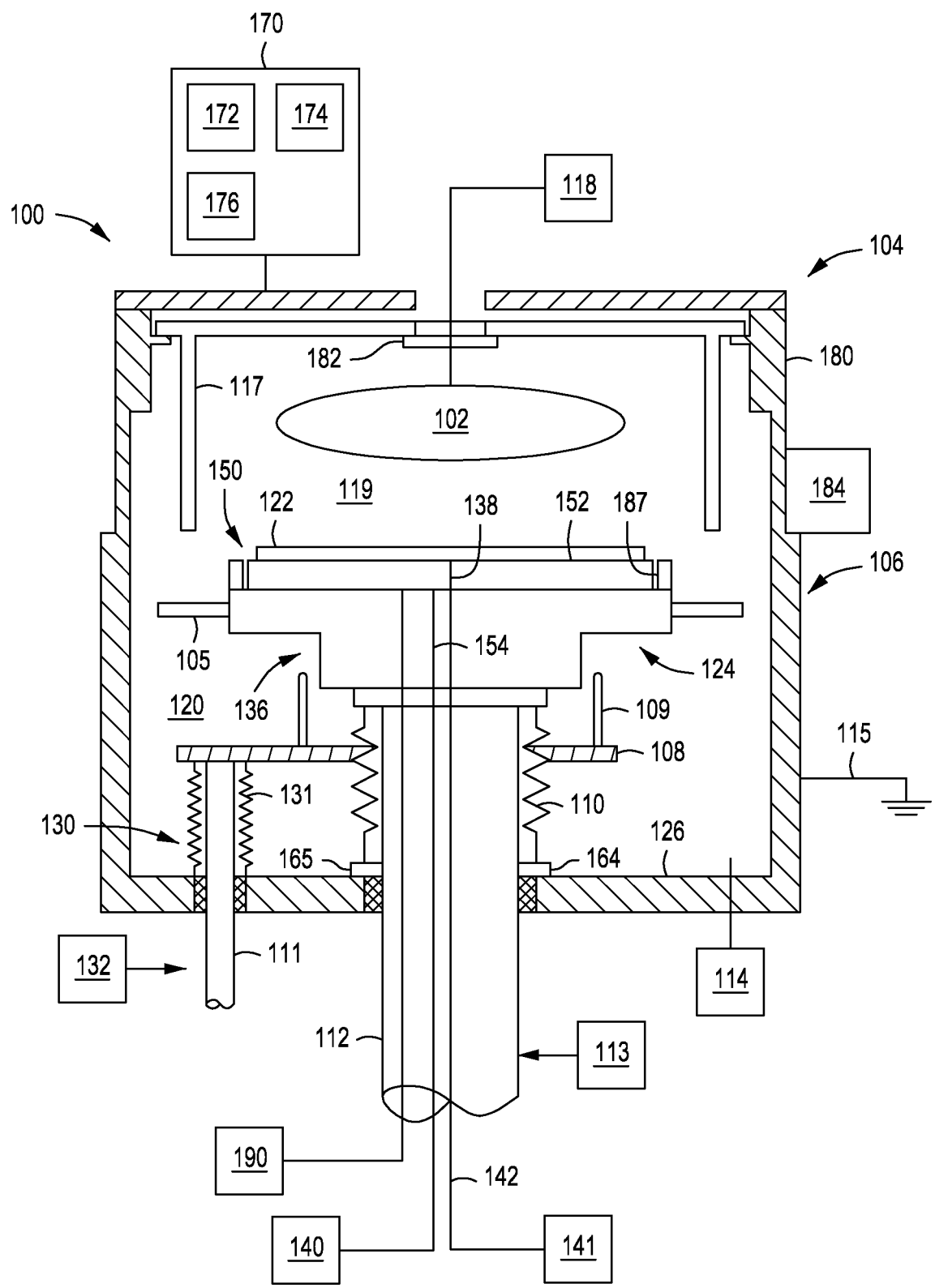
FIG. 1 depicts a cross-sectional view of process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus utilize a recyclable process kit, that dramatically enhances the number of wafers that can be run before periodic maintenance or cleaning is necessary. The recyclable process kit may be used in preclean chambers, but the present principles may also be applied to other chambers. The recyclable process kit includes a recyclable frame that is used to support a metallic foil liner that is attached to the frame in a manner which allows the foil liner to maintain a specific flexibility that prevents deposition particle contamination, in the chamber. The flexibility of the foil liner allows the re-sputtered deposition that occurs during cleaning to attach to the foil liner and remain attached even with high stress depositions. The flexibility of the foil liner remediates the high stresses within the depositions, allowing the depositions to remain attached to the foil liner instead of flaking off and contaminating the chamber. The enhanced bond between the depositions and the foil liner permit the recyclable process kit to be employed for a much higher number of wafers before the recyclable process kit needs to be replaced, sometimes two to three times or more the number of wafers in chambers with conventional process kits. In addition, the nonuniformity percentage (NU %) for the chamber is maintained throughout the prolonged process kit life.

Preclean chambers that process materials such as silicon nitride, silicon oxide, polymers, and metals suffer from short process kit life. The recyclable process kit of the present principles increases the kit life by more than two times while providing a recycle turnaround time of less than three hours as opposed to conventional process kits taking approximately three days or more. The metal foil liner and frame design with varying pattern and pitch enables a fast change or refurbishment of the process kit rather than traditional arc spray processes or any other type of coating. Moreover, the recyclable process kit helps to increase the performance of the preclean chamber. The benefits of using the recyclable process kit include mean wafer before clean (MWBC) improvements of over two times, particle count reduction, and prolonged kit life with less than a 2% NU % drift. The recyclable process kit also provides a lower process kit recycle cost, faster process kit recycle turnaround time, and better throughput.

FIG. 1 depicts a cross-sectional view of a process chamber (e.g., a plasma processing chamber) having a process kit in accordance with some embodiments. In some embodiments, the plasma processing chamber is a preclean processing chamber. However, other types of process chambers configured for different processes can also use or be modified for use with embodiments of the recyclable process kit described herein. The chamber 100 is a vacuum chamber which is suitably adapted to maintain sub-atmospheric pressures within an interior volume 120 during substrate processing. In some embodiments, the chamber 100 can maintain a pressure of about 1 mTorr to about 10 mTorr. The chamber 100 includes a chamber body 106 covered by a lid 104 which encloses a processing volume 119 located in the upper half of the interior volume 120. In some embodiments, the chamber 100 includes an adapter 180 disposed between the chamber body 106 and the lid 104 and resting on sidewalls of the chamber body 106. The chamber 100 includes a process kit circumscribing various chamber components to prevent unwanted reaction between such components and etched material and other contaminants. The chamber body 106, the adapter 180, and the lid 104 may be made of metal, such as aluminum. The chamber body 106 may be grounded via a coupling to ground 115.

A substrate support 124 is disposed within the interior volume 120 to support and retain a substrate 122, such as a semiconductor wafer, for example, or other such substrate as may be electrostatically retained. The substrate support 124 may generally comprise a pedestal 136 and a hollow support shaft 112 for supporting the pedestal 136. The pedestal 136 includes an electrostatic chuck 150. In some embodiments, the electrostatic chuck 150 comprises a dielectric plate. The hollow support shaft 112 provides a conduit to provide, for example, backside gases, process gases, fluids, coolants, power, or the like, to the electrostatic chuck 150. In some embodiments, the substrate support 124 includes an edge ring 187 disposed about the electrostatic chuck 150. In some embodiments, the edge ring 187 is made of alumina ($Al_2O_3$). A slit valve 184 may be coupled to the chamber body 106 to facilitate transferring the substrate 122 into and out of the interior volume 120.

The process kit includes an upper shield 117 circumscribing the substrate support 124. The upper shield 117 rests on the adapter 180 and may be configured to define the processing volume 119. In some embodiments, the upper shield 117 is made of metal such as aluminum. The process kit may include a lower shield 105 circumscribing the substrate support 124 which may be coupled to the pedestal 136. In some embodiments, the lower shield 105 is made of metal such as aluminum. The hollow support shaft 112 is coupled to a lift mechanism 113, such as an actuator or motor, which provides vertical movement of the electrostatic chuck 150 between an upper, processing position, and a lower, transfer position. A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while reducing or preventing loss of vacuum from within the chamber 100. The bellows assembly 110 also includes a lower bellows flange 164 in contact with an O-ring 165 or other suitable sealing element which contacts the bottom, surface 126 to help prevent loss of chamber vacuum.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include through-holes to receive the lift pins 109. A bellows assembly 131 is coupled between the substrate lift 130 and bottom surface 126 to provide a flexible seal which maintains the chamber vacuum during vertical motion of the substrate lift 130. The hollow support shaft 112 provides a conduit for coupling a backside gas supply 141, a chucking power supply 140, and a RE power supply 190 to the electrostatic chuck 150. In some embodiments, the chucking power supply 140 provides DC power to the electrostatic chuck 150 via conduit 154 to retain the substrate 122. In some embodiments, RF energy supplied by the RF power supply 190 may have a frequency of about 10 MHz or greater. In some embodiments, the RF power supply 190 may have a frequency of about 13.56 MHz.

The backside gas supply 141 is disposed outside of the chamber body 106 and supplies gas to the electrostatic chuck 150. The electrostatic chuck 150 may include a gas channel 138 extending from a lower surface of the electrostatic chuck 150 to an upper surface 152 of the electrostatic chuck 150. The gas channel 138 is configured to provide backside gas, such as nitrogen (N), argon (Ar), or helium (He), to the upper surface 152 of the electrostatic chuck 150 to act as a heat transfer medium. The gas channel 138 is in fluid communication with the backside gas supply 141 via gas conduit 142 to control the temperature and/or temperature profile of the substrate 122 during use. For example, the backside gas supply 141 can supply gas to cool the substrate 122 during use. The chamber 100 is coupled to and in fluid communication with a vacuum system 114 which includes a throttle valve (not shown) and pump (not shown) which are used to exhaust the chamber 100. In some embodiments, the vacuum system 114 is coupled to a pump port disposed on the bottom surface 126 of the chamber body 106. The pressure inside the chamber 180 may be regulated by adjusting the throttle valve and/or vacuum pump. In some embodiments, the pump has a flow rate of about 1900 liters per second to about 3000 liters per second.

The chamber 100 is also coupled to, and in fluid communication with a process gas supply 118 which may supply one or more process gases to the chamber 100 for processing a substrate disposed therein. In some embodiments, the lid 184 includes a port through which gas from the process gas supply 118 can be introduced into the interior volume 120. In some embodiments, the process gas supply 118 provides argon (Ar) gas. In some embodiments, a diffuser 182 is coupled to the upper shield 117 to inject gas from the process gas supply 118 into the processing volume 119 from a center of the upper shield 117. In operation, for example, a plasma 102 may be created in the interior volume 120 to perform one or more processes. The plasma 102 may be created by coupling power from a plasma power source (e.g., RF power supply 190) to a process gas via the electrostatic chuck 150 to ignite the process gas and create the plasma 102. The RF power supply 190 is also configured to attract ions from the plasma towards the substrate 122.

A controller 170 may be provided and coupled to various components of the chamber 100 to control the operation thereof. The controller 170 includes a central processing unit (CPU) 172, a memory 174, and support circuits 176. The controller 170 may control the chamber 100 directly, or via computers (or controllers) associated with a particular process chamber and/or support system components. The controller 170 may be one of any form of general-purpose computer processor that can be used in an industrial setting for controlling various chambers and sub-processors. The memory, or computer readable medium, 174 of the controller 170 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 176 are coupled to the CPU 172 for supporting the processor in a conventional manner. The circuits include cache, power supplies, clock circuits, input/output circuitry and subsystems, and the like. Methods to control the chamber 100 and/or processes may be stored in the memory 174 as software routine that may be executed or invoked to control the operation of the chamber 100 in the manner described herein. The software routine may also be stored and/or executed by a second CPU (not shown) that is remotely located from the hardware being controlled by the CPU 172.

Figure 2:
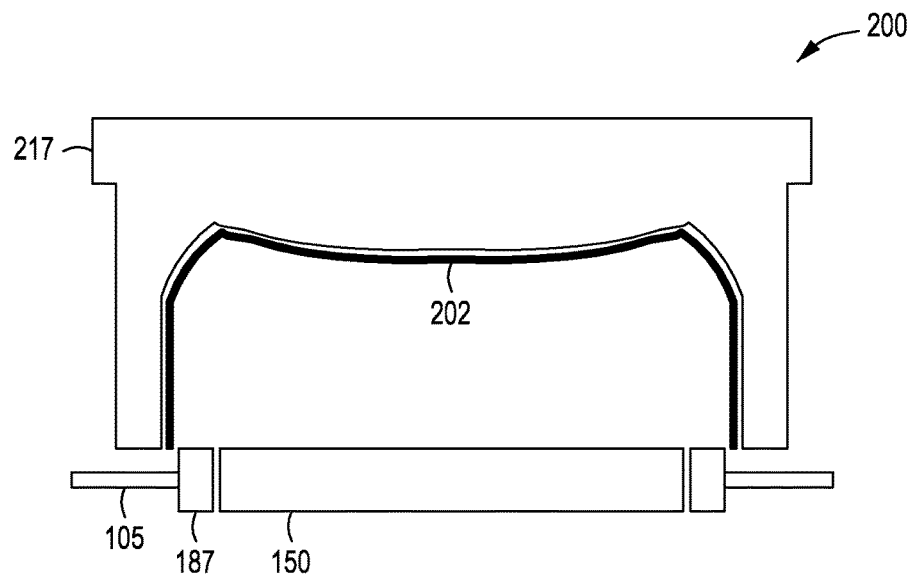
FIG. 2 depicts a cross-sectional view of an upper shield with a recyclable process kit in accordance with some embodiments of the present principles.

FIG. 2 depicts a cress-sectional view 200 of an upper shield 217 with a recyclable process kit 202 in accordance with some embodiments. The recyclable process kit 202 includes a metal foil liner that is attached in a specific manner to the frame which is fastened to the upper shield 217. The foil liner may be made from various materials such as gold, aluminum, copper, nickel, and/or titanium and the like. The material of the foil liner may be selected based on the type of material that will be deposited on the foil liner during processing. The material of the foil liner can be selected based on the amount of internal stress present in the deposited material. In some embodiments, the foil liner has a thickness of approximately 25 μm to approximately 225 μm. In some embodiments, the foil liner is welded to the frame using a pulsing laser and at specific points with specific spacing to allow a certain amount of flexibility in the foil liner based on the malleability of the metal material used to form the foil liner. In some embodiments, the foil liner is textured to promote adhesion of the deposition to the foil liner. In some embodiments, the surface roughness has a value of approximately 5 Ra (average roughness) to approximately 20 Ra. The recyclable process kit 202 can double the time between replacements while preventing peeling and reducing particle contamination by greater than 10 times over conventional process kits.

Figure 3:
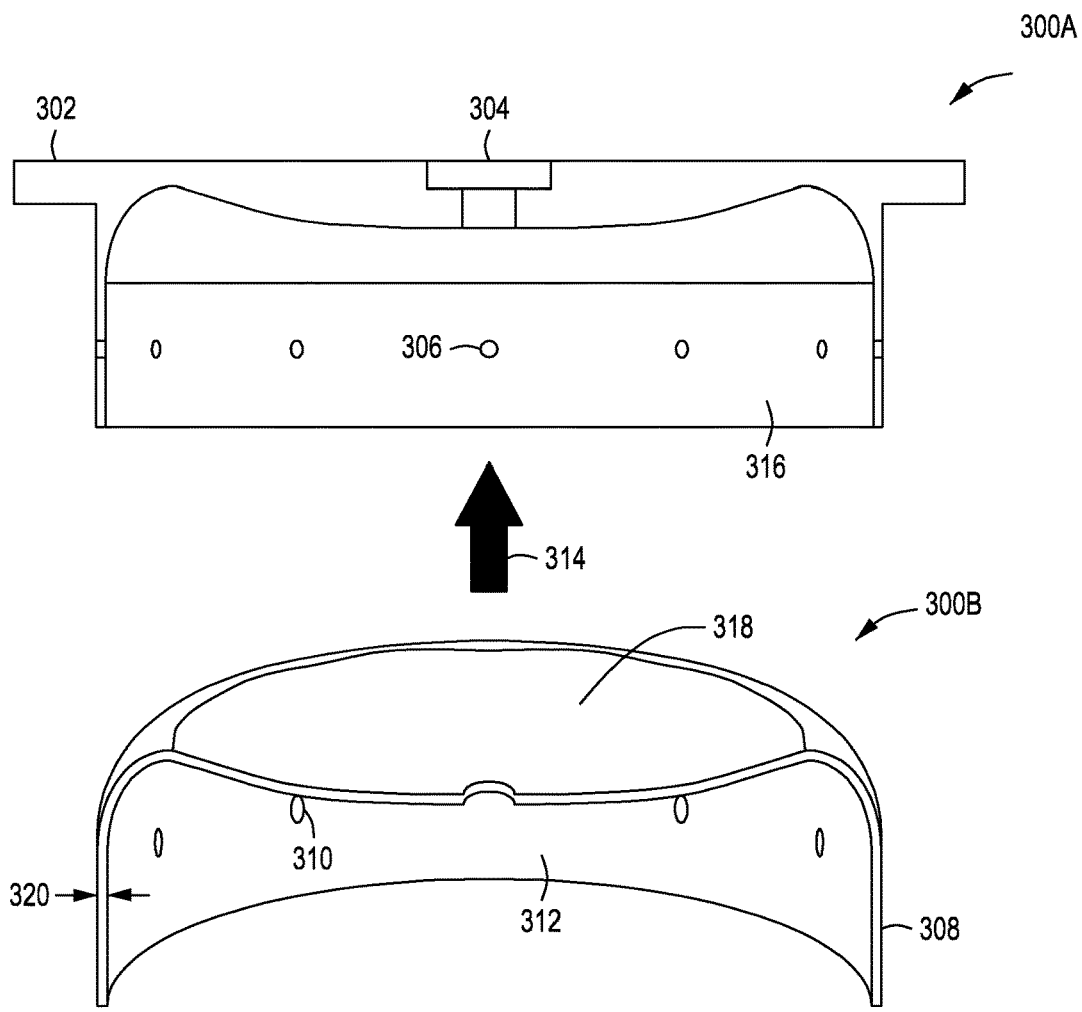
FIG. 3 depicts a cross-sectional view of an upper shield and an isometric view cutaway of a frame in accordance with some embodiments of the present principles.
Figure 4:
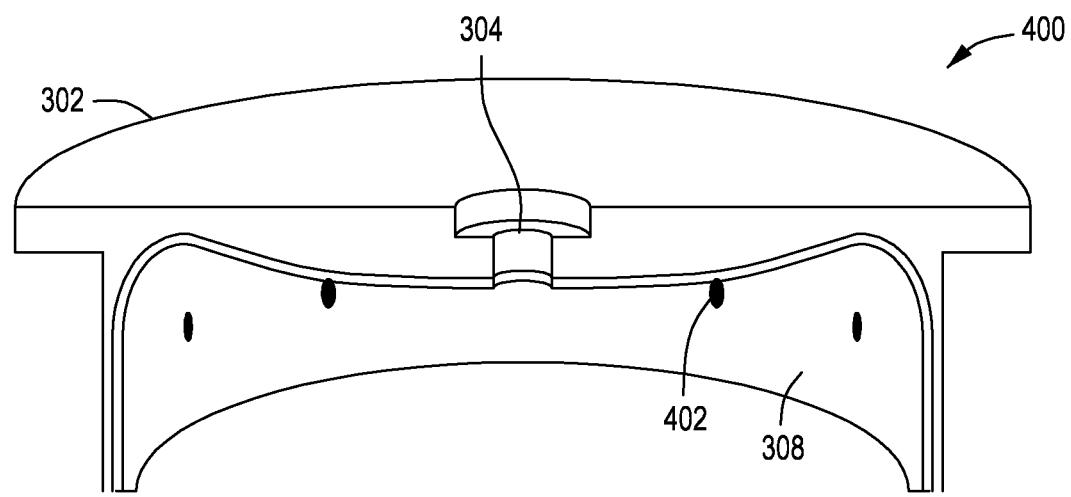
FIG. 4 depicts a cross-sectional isometric view of a frame installed in an upper shield in accordance with some embodiments of the present principles.

FIG. 3 depicts a cross-sectional view 300A of an upper shield 302 and an isometric view cutaway 300B of a frame 308 in accordance with some embodiments. The upper shield 302 includes a diffuser 304 (see, e.g., diffuser 182 of FIG. 1) and is modified with a series of attachment points 306 for the frame 308. In some embodiments, the attachment points 306 may include, but are not limited to, holes with threads to accept a screw type fastener and the like. The frame 308 may be formed from aluminum, copper, stainless steel, and/or titanium and the like. The frame 308 is not exposed to plasma and may be formed from any material that can support the foil liner. In some embodiments, the frame 308 has a thickness 320 of approximately 2 mm to approximately 4 mm. in some embodiments, the frame 308 has a thickness of approximately 3 mm. In some embodiments, the frame 308 includes through holes 310. The through holes 310 may be chamfered on an inner surface side 312 of the frame 308 to mate with a chamfered head of a screw type fastener. The frame 308 is insertable 314 into, the upper shield 302 and an outer surface 318 of the frame 308 mates with an inner surface 316 of the upper shield 302. FIG. 4 depicts a cross-sectional view 400 of a frame 308 inserted into the upper shield 302 in accordance with some embodiments. In some embodiments, the frame 308 is fastened to the upper shield 302 using a screw type fastener 402 with a chamfered head that mates with a chamfered through hole in the frame 308 and mates with threads in the threaded holes of the upper shield 302. The screw type fastener 402 is countersunk into the frame 308 so as to not interfere with the attachment of a foil liner.

Figure 5:
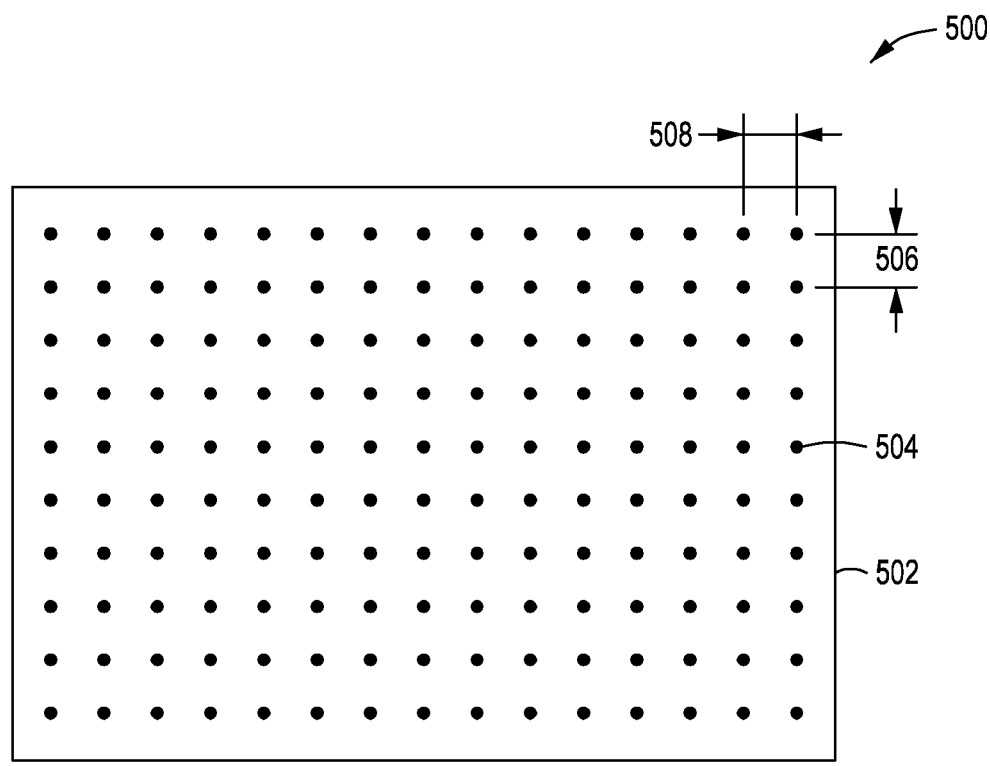
FIG. 5 depicts a cross-sectional view of a rectangular foil liner in accordance with some embodiments of the present principles.

FIG. 5 depicts a cross-sectional view 500 of a rectangular foil liner 502 in accordance with some embodiments. A preclean chamber is similar to a plasma etch, chamber where plasma is used to etch material away from the wafer. During the etching process, the materials on the wafer will be re-sputtered and redeposited on, the shield. Materials like silicon nitride, silicon oxide, or polymers and the like have very high internal stresses, almost double the amount of other materials. High internally stressed materials cause a stress buildup on a shield of a process kit leading to the cracking of the redeposited material which will flake off of the shield, contaminating the environment. The methods and apparatus of the present principles alleviate the stress of the redeposited material, reducing particle contamination.

The inventors have found that attaching the foil liner to the frame 308 using a uniform adhesive that covers an entire surface of the foil liner prevented deformation of the foil liner (and stress relief) and did not lead to any improvement over a conventional process kit in regard to particle contamination and process kit life. The inventors discovered that if the foil liner was instead attached at specific points with a specific spacing, the foil liner would remain flexible and provide dramatically superior deposition adhesion and stress relief, substantially reducing particle contaminations. The stress buildup on the shield is relieved due to the flexibility of the foil liner and significantly extends the life of the process kit. The flexibility of the foil liner allows stress release by deforming and preventing the redeposition from cracking and flaking off. By attaching the foil liner at different attachment points with specific distances or pitch, the foil liner's flexibility can be adjusted to reduce particle formation. A very high-density pitch causes less flexibility of the foil liner and produces more dropped particles. With a less dense pitch, or in other words, less attachment points, less particles are formed because the foil liner can flex more.

In addition, the inventors found that using a short-pulsed laser provided a way to spot weld the foil liner to the frame without damaging the foil liner or the frame. The very short pulse period prevents the laser from burning through the materials and possibly damaging the underlying shield or process kit. The short-pulsed laser was then used to weld the foil liner to the frame at various points with various spacing. In some embodiments, a fiber laser is used to weld the foil liner to the frame. The inventors found that when using a very thin aluminum for the foil liner a spacing or pitch pattern of approximately 30 mm or greater yielded a significant reduction in particle contamination. If the pitch pattern was significantly less than 30 mm (e.g., approximately 15 mm) for the given thin aluminum foil liner, the reduction in particle contamination was negligible. The inventors discovered that the malleability of the material used for the foil liner also directly affected the pitch pattern. Materials with a higher malleability could be spaced less than 30 mm and still produce a substantial reduction in particle contamination. Likewise, materials with lower malleability could be spaced farther apart than 30 mm to produce a substantial reduction in particle contamination. In addition, NU % does not drive more than 2% throughout the kit life.

Figure 6:
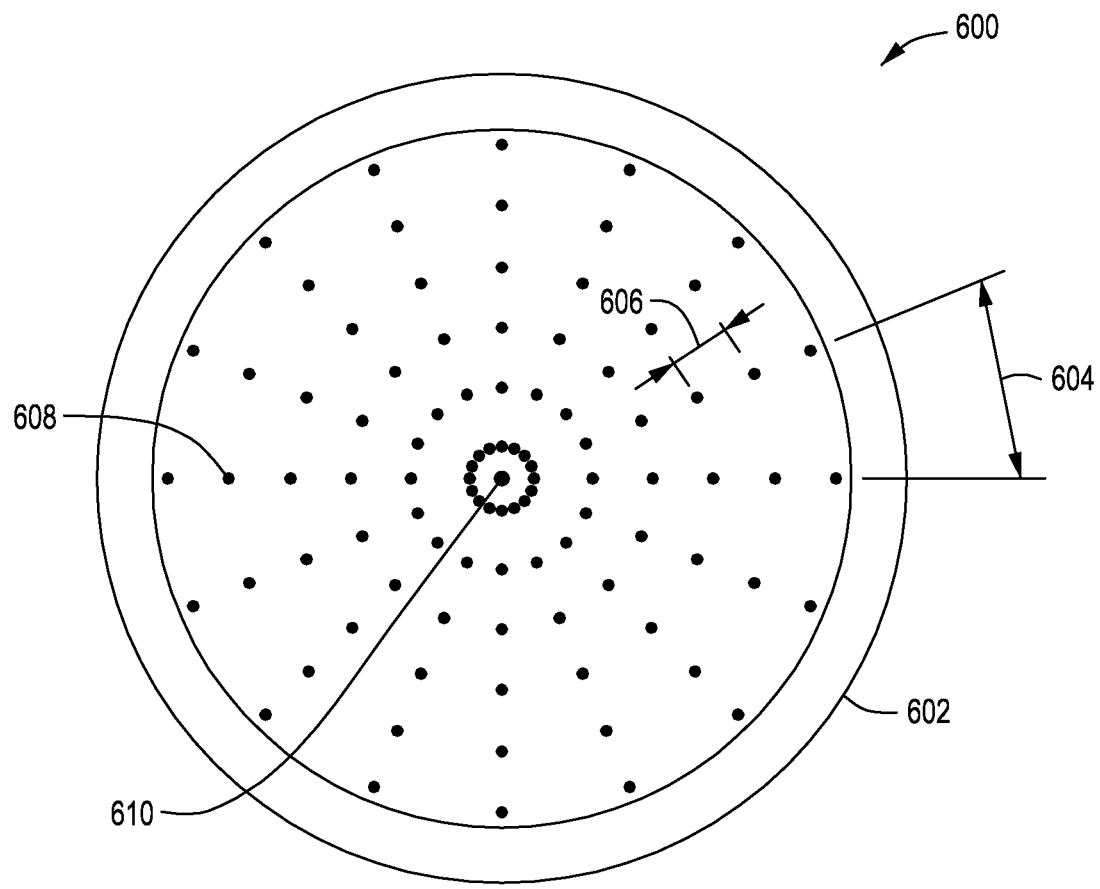
FIG. 6 depicts a cross-sectional view of a circular foil liner in accordance with some embodiments of the present principles.

For the sake of brevity, the following examples will use a foil liner constructed from thin aluminum material. The rectangular foil liner 502 of FIG. 5 illustrates a pitch pattern of approximately 30 mm or greater for the welding points 504. The distance A 506 between rows of welding points 504 and the distance B 508 between columns of welding points 504 are both equal to approximately 30 mm. For a rectangular or square foil liner, maintaining the distance between each welding point is fairly simple to accomplish. FIG. 6 depicts a cross-sectional view 600 of a circular foil liner 602 in accordance with some embodiments. In the example for the circular foil liner 602, welding points 608 are laid out in radial rays that emanate from a central point 610. As can be seen from FIG. 6, the pitch spacing (radial line spacing 606 and radial ray to radial ray spacing 604) is more difficult to maintain at approximately 30 mm. The inventors have found that trying to maintain an average 30 mm spacing for the welding points for a circular foil liner still yields significant reductions in particle contaminations.

Figure 7:
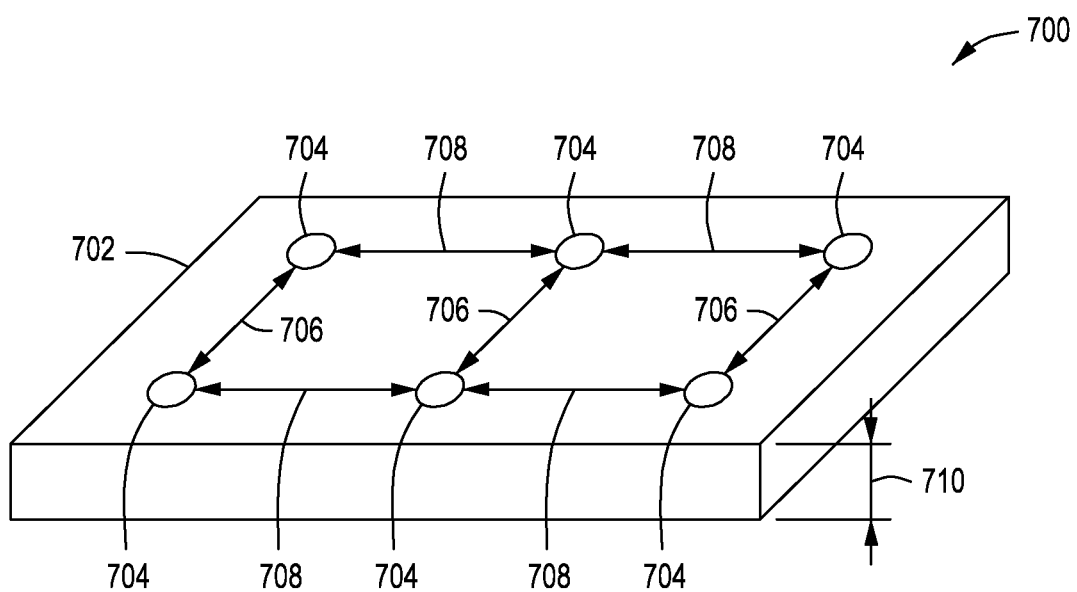
FIG. 7 depicts an isometric view of a portion of a material of foil liner in accordance with some embodiments of the present principles.

FIG. 7 depicts an isometric view 700 of a portion 702 of a material of foil liner in accordance with some embodiments. The attachment point pitch or, in some embodiments, the welding pitch is used to achieve a desired amount of flexibility of the attached foil liner for stress release of redeposited material. The desired pitch is related to a thickness 710 of the foil liner and the modulus of elasticity (malleability) of the material used for the foil liner:

$$\text{attachment point pitch (mm)} \propto \text{film thickness (mm)} \times \text{modulus of elasticity (GPa)} \quad \text{(Eq. 1)}$$

The attachment point pitch can be expressed as:

$$L = f \cdot t \cdot E \quad \text{(Eq. 2)}$$

where L is a distance 706, 708 between attachment points 704, t is a foil liner thickness 710, E is the modulus of elasticity for the material of the foil liner, and f is the proportional constant. The proportional constant f, regarded as the amount of flexibility, varies depending on the stress of the re-sputtered materials that will be deposited onto the foil liner. The amount of flexibility can be expressed as:

$$f = L/(t \cdot E) \quad \text{(Eq. 3)}$$

For example, if a copper foil liner is used for silicon nitride etching, an attachment point pitch distance of 30 mm is used to achieve good particle performance (particle contamination is reduced). In the example, the attached copper foil liner thickness may be 70 μm and the modulus of elasticity of copper is 117 GPa. Therefore, the amount of flexibility, f, can be calculated per GPa as:

$$f = 30 \text{ mm}/(0.07 \text{ mm} \times 117 \text{ GPa}) = 3.66/\text{GPa} \quad \text{(Eq. 4)}$$

The amount of flexibility per GPa, f, can vary between approximately 2.5 and approximately 4.5 for different re-sputtered material stress to achieve substantial particle contamination reduction.

As a further example of attachment point pitch, if the foil liner is formed from aluminum with a 100 μm thickness and a modulus of elasticity of 67 Gpa and an amount of flexibility of f=3.66, the attach pitch can be defined as:

$$L \text{ (mm)} = 3.66 \times 0.1 \times 67 = 24.5 \text{ mm} \quad \text{(Eq. 5)}$$

In another example, if the foil liner is formed from pure nickel with a 50 μm thickness and a modulus of elasticity of 170 Gpa and an amount of flexibility=4.0, the attachment point pitch can be defined as:

$$L(\text{mm}) = 4.0 \times 0.05 \times 170 = 34.0 \text{ mm} \quad \text{(Eq. 6)}$$

The range of attachment point pitch can be from approximately 10 mm to approximately 40 mm or greater depending on the properties of the material used for the foil liner and/or the desired amount of flexibility to relieve the internal stresses of a particular type of deposition material. The ability to account for multiple parameters allows for substantial flexibility in applying the apparatus and methods of the present principles to achieve superior particle control in process chambers.

Figure 8:
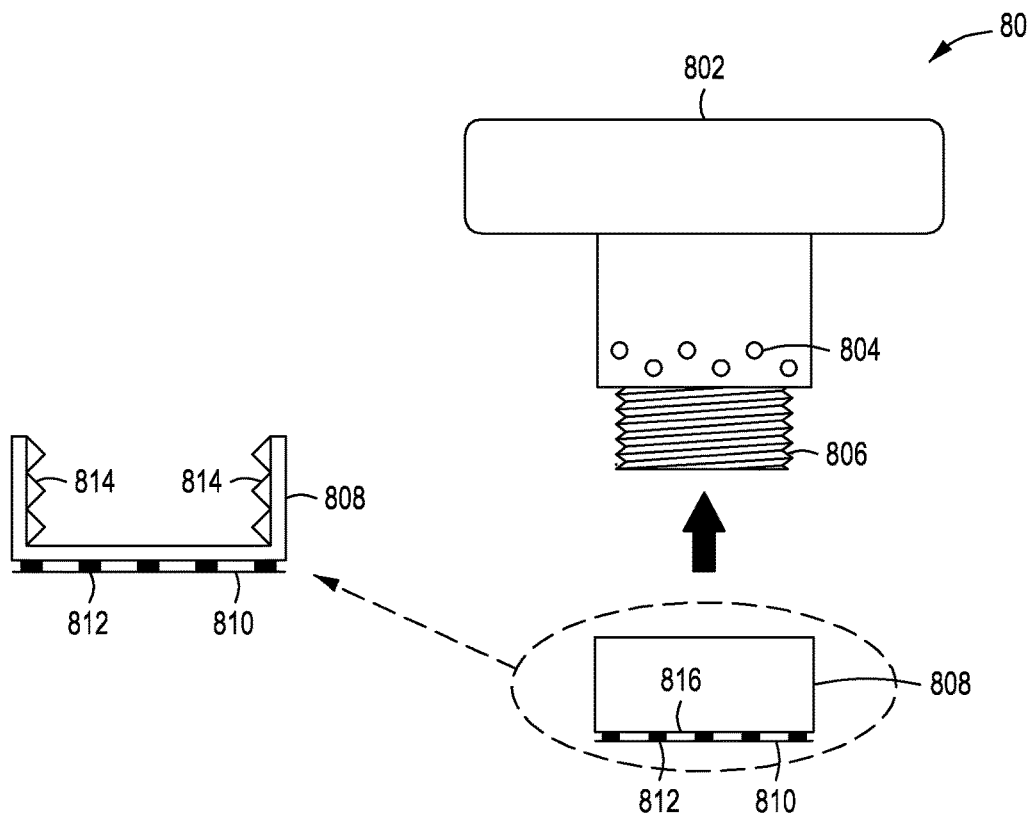
FIG. 8 depicts a side view of a diffuser in accordance with some embodiments of the present principles.

FIG. 8 depicts an isometric view 800 of a diffuser 802 in accordance with some embodiments. The diffuser 802 (see diffuser 182 of FIG. 1) is exposed to the processing volume 119 at a bottom exterior surface 816. The diffuser 802 has sidewall gas outlets 804 that are a vital part of processes in a preclean chamber. The inventors have devised a new diffuser structure with a removable cap 808 that can be removably attached to the diffuser 802. In some embodiments, the cap 808 includes inner threads 814 that mate with exterior threads 806 of the diffuser 802. In some embodiments, the cap 808 may be friction fit or press fit on the diffuser 802 and the like. The bottom exterior surface 816 of the cap 808 has foil liner 810 attached with weld points 812 at specific spacing. During process kit maintenance, the cap 808 can be easily replaced with minimal downtime. The diffuser 802 is a very small part and the foil liner 810 is attached in such a way as to not affect the sidewall gas outlets 804. When the diffuser 802 is installed in the chamber 100, a small circular gap remains around the diffuser 802 to allow gas into the processing volume 119. If the gas is blocked, the uniformity will be negatively affected. The foil liner 810 is attached so that the circular gap is not blocked, allowing gas to flow freely into the processing volume 119.

In some embodiments, when maintenance is required, the process kit along with the frame and foil liner can be removed together. The foil liner is then detached from the frame and, in some circumstances, the frame can be detached from the process kit or shield. Because the process kit or shield is protected by the frame and foil liner, the process kit or shield would require little or no cleaning. In other instances, the frame may be left attached to the shield and a new foil liner attached to the frame in-situ in the shield. Because the frame can be reused or recycled and the deposition on the foil liner is removed along with the foil liner, the maintenance process can be performed in three hours or less compared to a conventional process requiring more than three days. In some embodiments, the frame and foil liner can be inserted into the shield together as a single unit. The attachment points of the frame would allow the foil liner to remain undisturbed during installation or removal from the shield. A spare frame and foil liner unit could then be kept as a complete spare for quick swapping at the time of maintenance.

Figure 9:
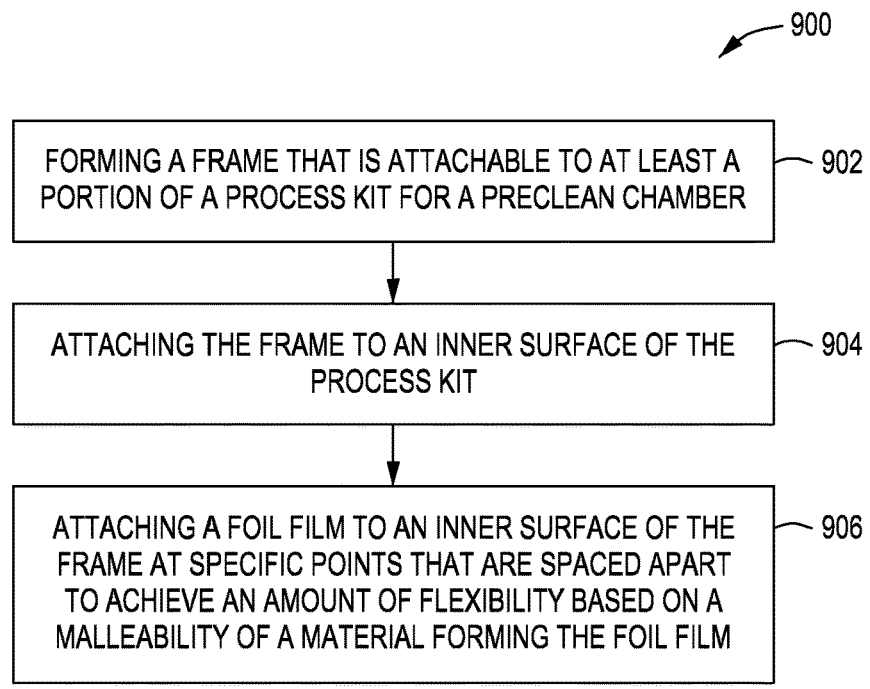
FIG. 9 is a method of attaching a frame and foil liner to a process kit in accordance with some embodiments of the present principles.

FIG. 9 is a method 900 of attaching a frame and foil liner to a process kit in accordance with some embodiments. In block 902, a frame is formed that is attachable to at least a portion of a process kit for a preclean chamber. The frame can be formed from materials such as aluminum, copper, and/or titanium and the like. In block 904, the frame is attached to an inner surface of the process kit. In some embodiments, the frame may be attached to the process kit with a screw type fastener. In block 906, a foil liner is attached to an inner surface of the frame at specific points that are spaced apart to achieve an amount of flexibility based on a malleability of the material forming the foil liner. Different types of material will have different malleability levels which directly affect the attachment point spacing to produce a certain flexibility that will produce a significant reduction in particle contamination. The amount of flexibility can be calculated using Equation 3 above. In some embodiments, the amount of flexibility per GPa to achieve a substantial reduction in particle contamination will range from approximately 2.5 to approximately 4.5. In some embodiments, the type of material that will be redeposited on the foil liner will be used to adjust the amount of flexibility to achieve superior particle control.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for protecting a processing volume of a process chamber, comprising:
   a frame configured to be insertable into a process kit shield; and
   a foil liner composed of a metallic material spot welded to the frame at specific points and having an amount of flexibility per GPa of approximately 2.5 to approximately 4.5, wherein the amount of flexibility is determined by $f=L/(t \times E)$, where f is the amount of flexibility, L is a distance of separation of the specific points, t is a thickness of the foil liner, and E is the modulus of elasticity of the metallic material.

2. The apparatus of claim 1, wherein the amount of flexibility is approximately 4.5.

3. The apparatus of claim 1, wherein the frame is formed from aluminum, copper, titanium, or stainless steel.

4. The apparatus of claim 1, wherein the foil liner is made of aluminum, copper, titanium, nickel, or gold.

5. The apparatus of claim 1, wherein the foil liner is aluminum and the specific points are spaced approximately 30 mm apart.

6. The apparatus of claim 1, wherein the foil liner is rectangular or circular in shape.

7. The apparatus of claim 1, wherein the frame is attached to the process kit shield with a screw type fastener.

8. The apparatus of claim 1, further comprising:
   a diffuser with the foil liner attached to a lowermost portion.

9. The apparatus of claim 8, wherein the diffuser has a removable cap in the lowermost portion, the foil liner being attached to the removable cap.

10. The apparatus of claim 1, wherein the frame is approximately 3 mm in thickness.

11. The apparatus of claim 1, wherein the foil liner has a thickness of approximately 25 microns to approximately 225 microns.

12. An apparatus for processing semiconductor structures, comprising:
   a preclean chamber having a chamber body with a processing volume;
   a process kit that surrounds at least a portion of the processing volume;
   a frame inserted into the process kit; and
   a foil liner composed of a metallic material that is spot welded to the frame at specific points and having an amount of flexibility per GPa of approximately 2.5 to approximately 4.5, wherein the amount of flexibility is determined by $f=L/(t \times E)$, where f is the amount of flexibility, L is a distance of separation of the specific points, t is a thickness of the foil liner, and E is the modulus of elasticity of the metallic material.

13. The apparatus of claim 12, wherein the amount of flexibility is approximately 4.5.

14. The apparatus of claim 12, wherein the frame is formed from aluminum, copper, titanium, or stainless steel.

15. The apparatus of claim 12, wherein the foil liner is made of aluminum, copper, titanium, nickel, or gold.

16. The apparatus of claim 12, wherein the foil liner is aluminum and the specific points are spaced approximately 30 mm apart.

17. The apparatus of claim 12, wherein the frame is attached to the process kit with a screw type fastener.

18. A method of protecting a process kit, comprising:
    forming a frame that is attachable to at least a portion of a process kit for a preclean chamber;
    attaching the frame to an inner surface of the process kit; and
    spot welding a foil liner composed of a metallic material to an inner surface of the frame at specific points, the foil liner having an amount of flexibility per GPa of approximately 2.5 to approximately 4.5, wherein the amount of flexibility is determined by $f=L/(t \times E)$, where f is the amount of flexibility, L is a distance of separation of the specific points, t is a thickness of the foil liner, and E is the modulus of elasticity of the metallic material.

19. The method of claim 18, wherein the amount of flexibility is approximately 4.5 when silicon nitride, silicon oxide, or polymers are to be deposited on the foil liner.

20. The method of claim 18, wherein the foil liner is made of aluminum, copper, titanium, nickel, or gold.

* * * * *